United States Patent [19]
Eshita et al.

[11] Patent Number: 4,855,254
[45] Date of Patent: Aug. 8, 1989

[54] METHOD OF GROWING A SINGLE CRYSTALLINE β-SIC LAYER ON A SILICON SUBSTRATE

[75] Inventors: Takashi Eshita, Inagi; Fumitake Mieno; Yuji Furumura, both of Kawasaki; Kikuo Itoh, Yokohama, all of Japan

[73] Assignee: Fujitsu Limited, Kawasaki, Japan

[21] Appl. No.: 283,642

[22] Filed: Dec. 13, 1988

[30] Foreign Application Priority Data

Dec. 19, 1987 [JP] Japan ................... 62-320100

[51] Int. Cl.$^4$ .................. H01L 21/20; C04B 35/56
[52] U.S. Cl. .................. 437/100; 148/DIG. 148; 156/612; 156/DIG. 64; 156/613; 156/614; 437/103
[58] Field of Search ............... 437/100, 103, 108; 148/DIG. 148; 427/248.1, 249; 156/610, 612, DIG. 64, 613, 614, 600

[56] References Cited

U.S. PATENT DOCUMENTS

| H000,028 | 2/1986 | Addamiano | 156/612 |
|---|---|---|---|
| 3,956,032 | 5/1976 | Powell et al. | 156/612 |
| 3,960,619 | 6/1976 | Seiter | 437/100 |
| 4,459,338 | 7/1984 | Angelini et al. | 427/249 |
| 4,623,425 | 11/1986 | Suzuki et al. | 156/612 |

FOREIGN PATENT DOCUMENTS

0269439 1/1988 European Pat. Off. .
0155512 7/1987 Japan .

OTHER PUBLICATIONS

Nishino et al., "Reproducible Preparation of Cubic-SiC Single Crystals by Chemical Vapor Deposition", Extended Abs. of the 15th Conference on Solid State Devices and Materials, Tokyo, 1983, pp. 317–320.
Addamiano et al., "'Buffer-Layer' Technique for the Growth of Singel Crystal SiC on Si", Appl. Phys. Lett., vol. 44, No. 5, Mar. 1, 1984, pp. 525–527.
Suzuki et al., "Epitaxial Growth of β-SiC Single Crystals by Successive Two-Step CVD", J. of Crystal Growth, vol. 70, 1984, pp. 287–290.
Addamiano et al., "Chemically-Formed Buffer Layers for Growth of Cubic Silicon Carbide on Silicon Single Crystals", J. of Crystal Growth, vol. 70, 1984, pp. 291–294.
Nishino et al., "Chemical Vapor Deposition of Single Crystalline β-SiC Films on Silicon Substrate with Sputtered SiC Intermediate Layer", J. Elecrochem. Soc., vol. 127, No. 12, Dec. 1980, pp. 2674–2680.
Nishino et al., "Production of Large-Area Single-Crystal Wafers of Cubic SiC for Semiconductor Devices", Appl. Phys. Lett., vol. 42, No. 5, Mar. 1, 1983, pp. 460–462.
Learn et al., "Low-Temperature Epitaxy of β-SiC by Reactive Deposition", Appl. Phys. Lett. vol. 17, No. 1, Jul. 1, 1970, pp. 26–29.

Primary Examiner—Brian E. Hearn
Assistant Examiner—M. Wilczeulski
Attorney, Agent, or Firm—Armstrong, Nikaido, Marmelstein, Kubovcik & Murray

[57] ABSTRACT

A single crystalline silicon carbide (β-SiC) layer having a thickness greater than 1 μm is grown on a silicon substrate by the follwoing method of the present invention. The silicon substrate is provided in a reactor chamber, and the reactor chamber is evacuated and maintained at a reduced atmospheric pressure during the growing processes. While flowing a mixed gas containing acetylene into the reactor chamber, the substrate is heated up at a temperature range from 800° to 1000° C., preferable in a range from 810° to 850° C., whereby a buffer layer of carbonized silicon having a thickness of 60 to 100 Å is grown on the substrate. Thereafter, the flowing gas is changed to a mixed gas containing hydrocarbon and chlorosilane, and the substrate temperature is raised to a temperature from 850° to 950° C. In this process, a single crystalline β-SiC layer can be grown on the buffer layer, and a thickness of a few μm for the grown β-SiC layer can be expected.

12 Claims, 4 Drawing Sheets

METHOD OF GROWING A SINGLE CRYSTALLINE β-SIC LAYER ON A SILICON SUBSTRATE

BACKGROUND OF THE INVENTION

1. Field of the Invention

This invention relates to a method of growing a β-SiC layer on a silicon substrate. More specifically, this invention concerns a method of growing a single crystalline β-SiC layer on a silicon substrate, in which all processes are performed heating the substrate at temperatures below 1000° C. A heterojunction formed between a β-SiC layer and a silicon substrate has a promising application for high-speed and high-power transistors working at a high temperature.

2. Description of the Related Art

Compared with silicon, silicon carbide SiC has a wide energy gap of 2.2 eV and has other distinctive features in heat resisting property, thermal conductivity, break down voltage, saturated electron drift velocity, etc. Silicon carbide has several crystalline structures such as 3C-SiC (cubic system, called β-SiC) and 6H-SiC (hexagonal system, called α-SiC). Especially, β-SiC having an energy gap of 2.2 eV is popular and has been the subject of investigation for developing a high temperature FET (Field Effect Transistor), a light emitting diode of green rays, and a heterojunction bipolar transistor using the heterojunction between a silicon substrate and a single crystalline β-SiC layer grown thereon.

In order to grow a single crystalline β-SiC layer on a silicon substrate, several methods have been investigated. Among them, a CVD method is most popular, in which the substrate is heated up at a temperature around 1300° C. using, for example, propane $C_3H_8$ and silane $SiH_4$ (or trichlorosilane $SiHCl_3$) gases as source material gases and a hydrogen gas as a carrier gas.

The problem encountered in the above method is that the grown β-SiC layer shows deterioration in a crystalline structure when a thickness of the grown β-SiC layer becomes greater than 1 μm. The grown layer does not show a β-SiC epitaxial layer or a single crystalline structure of β-SiC but rather a poly-crystalline structure. Therefore, it can not be used for fabricating a semiconductor device using a thick β-SiC layer on a silicon substrate. The main reason for the deterioration of crystalline structure is due to a lattice mismatch between the silicon and β-SiC crystals. Because the lattice constant of silicon is 5.430 Å and that of β-SiC, 4.358 Å, the difference being about 20% therebetween.

In order to improve the crystalline quality of the grown β-SiC layer, a method of growing an intermediate layer by carbonizing silicon substrate between the silicon substrate and the β-SiC layer has been proposed. The intermediate layer is comparatively thin and relieves the stress between the silicon substrate and the grown single crystalline β-SiC layer. The intermediate layer having thickness of several tens Å to a few hundred Å acts as a buffer layer for the epitaxial β-SiC layer.

The method of growing the buffer layer of the prior art includes the steps of heating up the silicon substrate in a temperature range between 1300° C. to 1350° C. and introducing a propane $C_3H_8$ gas as a source material gas. When a thickness of the buffer layer is sufficiently thin, the grown β-SiC layer on the buffer layer shows a single crystalline β-SiC structure and it does not become a serious problem in forming a heterojunction between the silicon substrate and the β-SiC epitaxial layer grown on the buffer layer. Though it has become possible to decrease the growth temperature of the single crystalline β-SiC on the buffer layer to a temperature less than 1000° C., the temperature 1300° to 1350° C. for growing the buffer layer is extremely high when the fact is taken into consideration that the melting point of silicon is about 1400° C.

The high temperature of growing the buffer layer beneath the single crystalline β-SiC layer in the prior art has bad influences on the silicon substrate such as extension of an impurity diffusion region, mechanical deformation of the substrate, etc. Many efforts have been directed to decrease the growth temperature of the buffer layer or to eliminate the process of growing the buffer layer by growing the β-SiC epitaxial layer directly on the silicon substrate.

SUMMARY OF THE INVENTION

It is a general object of the invention, therefore to provide an improved method of growing a single crystalline β-SiC epitaxial layer above a silicon substrate sandwiching an intermediate buffer layer.

It is a more specific object of the invention to provide a method in which all processes are performed in a temperature range lower than 1000° C.

It is another object of the invention to provide a method of growing an intermediate buffer layer and a single crystalline β-SiC layer continuously on a silicon substrate utilizing a simple system of chemical vapor deposition (abbreviated as CVD), wherein the source material gases are changed and a temperature of the substrate is controlled lower than 1000° C. during all growing processes.

It is still another object of the invention to provide a method of growing a single crystalline β-SiC layer having a superior quality in surface morphology of the grown β-SiC epitaxial layer, even when a thickness thereof exceeds a few μm.

These and other objects are accomplished by a method using a CVD process of the present invention, in which an intermediate buffer layer of such as carbonized silicon is grown on a silicon substrate using an acetylene $C_2H_2$ gas as a source material gas and heating the substrate up to a temperature range between 800° and 1000° C., preferable between 810° to 850° C. Thereafter a β-SiC epitaxial layer is grown thereon using the mixed gas of a chlorosilane (trichlorosilane $SiHCl_3$ or dichlorosilane $SiH_2Cl_2$) gas and a hydrocarbon (acetylene $C_2H_2$ or propane $C_3H_8$) gas as source material gases.

Because an acetylene $C_2H_2$ gas is more active than other hydrocarbon gases, it is expected to react with silicon at temperatures below 1300° C. In the present invention, it is found that the buffer layer can be grown at a temperature as low as 800° C. when an acetylene gas $C_2H_2$ is used as a source material gas.

DETAILED DESCRIPTION OF THE PREFERRED EMBODIMENTS

Figures 1, 2:
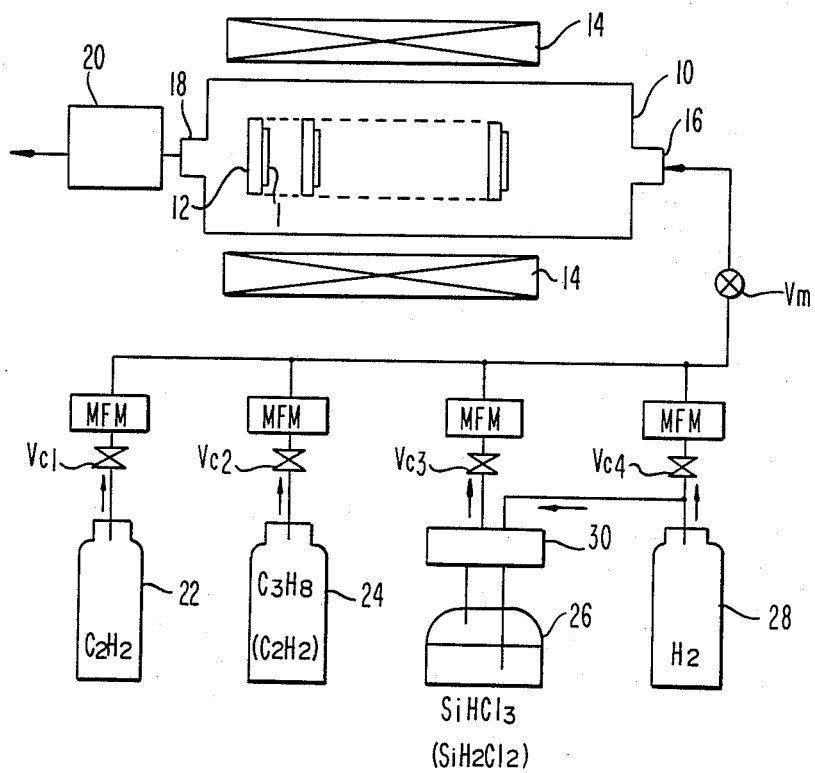
FIG. 1 is a schematic partial cross section of a silicon substrate together with a buffer layer and a single crystalline β-SiC layer according to the present invention.
FIG. 2 is a gas flow diagram and a schematic cross section of a reactor chamber for chemical vapor deposition utilized in the present invention.

FIG. 1 is a schematic partial cross section of a silicon substrate 1 together with two grown layers thereon according to the present invention. The lower layer is a buffer layer 2 of carbonized silicon and the upper layer is a single crystalline β-SiC layer 3. These two layers are grown on the silicon substrate 1 one after another by a CVD method. In growing a single crystalline β-SiC epitaxial layer, it is preferable to use a silicon substrate with an off-axial (111) orientation. In the embodiments, a silicon substrate with an orientation of 4°-off (111) toward [2$\bar{1}\bar{1}$] (hereinafter, abbreviated as Si(111) 4°-off) is utilized.

The reason for using a silicon (111) substrate with an off-axial orientation is disclosed in the following report and Japanese Unexamined Patent Publication, and their disclosures are hereby incorporated by reference.

"Heteroepitaxial β-SiC on Si" by Y. Furumura et al: Journal of the Electrochemical Society, Vol. 135, No. 5, May 1988.

"SHO-62-155512" opened on July 10, 1987, by M. Doki, F. Mieno, et al.

The above two disclosures are related to a method of growing a single crystalline β-SiC layer directly on a silicon (111) substrate with an off-axial orientation without a buffer layer, in which the single crystalline β-SiC layer is grown at a temperature equal to or lower than 1000° C. The first reference discloses that a single crystalline β-SiC layer having a thickness of a few hundred nm is satisfactorily grown on the silicon substrate. The angle between 0.2° and 10° for the off-axial orientation can be utilized. However, in the following embodiments, a Si(111) 4°-off substrate is utilized.

When a single crystalline β-SiC layer having a thickness greater than 1 μm is needed for fabricating a heterojunction bipolar transistor or a high temperature FET, it is found that the surface morphology of the β-SiC layer grown by the above referred method deteriorates with an increase of the thickness. Nevertheless, it is still effective to utilize a Si(111) 4°-off substrate for a case where the buffer layer is formed between the silicon substrate and the β-SiC epitaxial layer.

In the prior methods of growing a buffer layer with the aim of relaxing a lattice mismatch between a silicon substrate and a β-SiC epitaxial layer, a high temperature of above 1300° C. is needed for growing the buffer layer as explained in the related art. In order to decrease the temperature of growing the buffer layer, the method of the present invention utilizes an apparatus shown in FIG. 2. It shows a gas flow diagram and a schematic cross section of a reactor chamber for chemical vapor deposition.

In FIG. 2, the silicon substrate 1 is mounted on a susceptor 12 and installed in a reactor chamber 10 of a horizontal type. Usually, a plurality of substrates is arranged in the reactor chamber 10 and processed at the same time. Outside the reactor chamber 10, a high frequency induction coil 14 is provided to heat up the susceptor 12 of carbon such as graphite together with the substrate 1 mounted thereon. The reactor chamber 10 provides an inlet 16, through which a mixed gas is introduced from a gas supply system, and further provides an outlet 18, with which an exhaust system 20 is connected.

A gas supply system in FIG. 2 comprises three material gas sources. An acetylene $C_2H_2$ gas source 22 is provided in a first bottle; a propane $C_3H_8$ or acetylene gas source 24, in second bottle; and a trichlorosilane $SiHCl_3$ or dichlorosilane $SiH_2Cl_2$ gas source 26, in a bubbler. Further, a hydrogen $H_2$ gas source 28 is provided in a third bottle, and the hydrogen gas is used as a carrier gas, which dilutes the material gas and removes the native oxide layer on the substrate 1. Because trichlorosilane $SiHCl_3$ or dichlorosilane $SiH_2Cl_2$ is liquid at room temperature, it is bubbled by a hydrogen gas which is supplied from the hydrogen gas source 28.

Each gas source comprises a mass flow meter MFM and a flow control valve Vc such as a needle valve. A combination of the mass flow meter MFM and flow control valve Vc may be replaced by a mass flow controller. As for the bubbler, a vaporization controller 30 is provided, which includes plural valves and controls a flow rate of a hydrogen bubbling gas and an output mixed gas of hydrogen and trichlorosilane $SiHCl_3$ (or dichlorosilane $SiH_2Cl_2$).

After loading the silicon substrates 1 in the reactor chamber 10, the exhaust system 20 is used to evacuate the reactor chamber 10. The pressure in the reactor chamber is reduced, and is maintained at a pressure less than 10 Torr (typically around 3 to 5 Torr). This pressure value is maintained during the whole subsequent growing processes. The main valve Vm and the flow control valve $Vc_4$ for the hydrogen gas source 26 are opened. The flow control valve $Vc_4$ is adjusted such that a flow rate of the hydrogen gas such as 1 to 20 SLM (Standard Liter per Minute) can be obtained. In the embodiment, a gas flow rate in a range from 7 to 10 SLM is used. Thereafter, the susceptor 12 is heated up for about 10 minutes by the high frequency induction coil 14, resulting in raising a substrate temperature up to 800° to 1000° C. A lower temperature range such as 810° to 850° C. is preferable. This process cleans the surface of the silicon substrate 1 by removing a thin film of silicon dioxide formed by natural oxidation.

Maintaining the hydrogen gas flow and the substrate temperature untouched, the flow control valve $Vc_1$ for the acetylene $C_2H_2$ gas source 22 is opened, and the flow rate of the acetylene gas is controlled in a range from 5 to 30 SCCM (Standard Cubic Centimeter per Minute), preferable in a range from 15 to 25 SCCM. With an introduction of the acetylene gas, a silicon substrate is carbonized and a buffer layer begins to grow on the silicon substrate 1. The buffer layer having a thickness of 6 to 10 nm can be obtained for 5 to 10 minute growth. The growth rate of the buffer layer depends on the substrate temperature and the flow rate of the acetylene gas.

Figure 5:
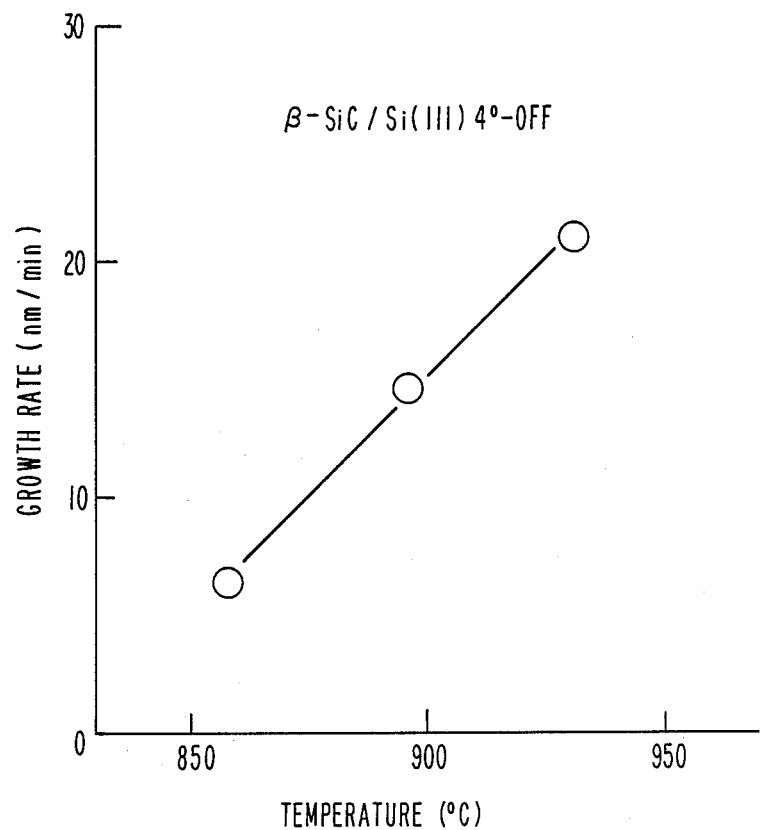
FIG. 5 shows an example of a growth rate characteristic of the single crystalline β-SiC versus substrate temperature.

And next, the flow control valve $Vc_1$ is closed, and the flow control valves $Vc_2$ and $Vc_3$ are opened. The flow rate of a propane $C_3H_8$ gas is controlled in a range between 10 and 40 SCCM, and the flow rate of a trichlorosilane SiHCl$_3$ gas is controlled at about 0.1 to 1.0 SLM, maintaining the same flow rate for the hydrogen gas source 28. A mixing ratio of the propane gas to trichlorosilane gas is preferable to be about 1:30–35. Because the hydrogen gas is a carrier gas, its flow rate is much larger than that of the above two source gases added together, for example, about 10 times of the flow rate of the mixture of other two gases. While introducing a mixed gas of propane C$_3$H$_8$, trichlorosilane SiHCl$_3$ and hydrogen into the reactor chamber 10, the substrate 1 is heated up to a temperature about or less than 1000° C. A temperature range of 900°±50° C. is more preferable. During the above growing process, a single crystalline β-SiC layer 3 is grown on the buffer layer 2 as shown in FIG. 1. When a lower growth temperature is applied during the growth, the growth rate of the β-SiC epitaxial layer becomes smaller. An example of the growth rate characteristic versus substrate temperature is shown in FIG. 5. However, the lower substrate temperature during the growth is desirable to avoid bad influences on the substrate structure.

In the above embodiment, the trichlorosilane SiHCl$_3$ gas source may be replaced by a dichlorosilane SiH$_2$Cl$_2$ gas source. And further, the propane C$_3$H$_8$ gas can be replaced by other hydrocarbon gases having a molecular structure comprising two or three carbon atoms in a single molecule, such as an acetylene C$_2$H$_2$ gas. In case of using an acetylene gas, the acetylene C$_2$H$_2$ gas source 22 can be used as a common gas source for growing both buffer layer 2 and single crystalline β-SiC layer 3.

Figure 3A:
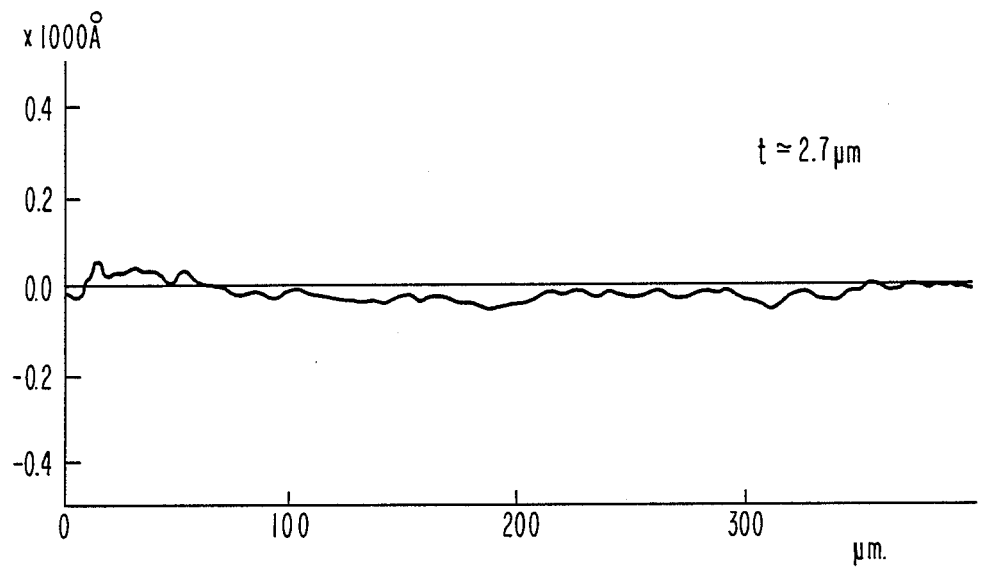
FIG. 3(a) shows a surface roughness of the grown single crystalline β-SiC layer by the present invention measured by a surface profiler ALPHA-STEP by TENCOR INSTRUMENTS.

FIG. 3(a) shows a trace of a measured surface roughness of the grown β-SiC layer on a Si(111) 4°-off substrate according to the method of the present invention, and it is clear that the surface of the β-SiC grown by the present invention is very flat. In the figure, the ordinate of the curve indicates a measured relative height of the grown surface detected by a stylus, whereby the stylus is scanned horizontally on the substrate surface. The curve is measured using a surface profiler called AL-PHA-STEP made by TENCOR INSTRUMENTS, Calif. U.S.A. Test pieces are prepared from 2.7 μm thick single crystalline β-SiC grown on a Si(111) 4°-off substrate with a buffer layer of 60 Å thickness. The growth temperature of the buffer layer is about 850° C. and that for the single crystalline β-SiC layer is about 900° C., thereby the trichlorosilane SiHCl$_3$, propane C$_3$H$_8$ and hydrogen gas system being used. FIG. 3(a) shows that even the maximum deviation from an average level falls within about ±50 Å.

Figure 3B:
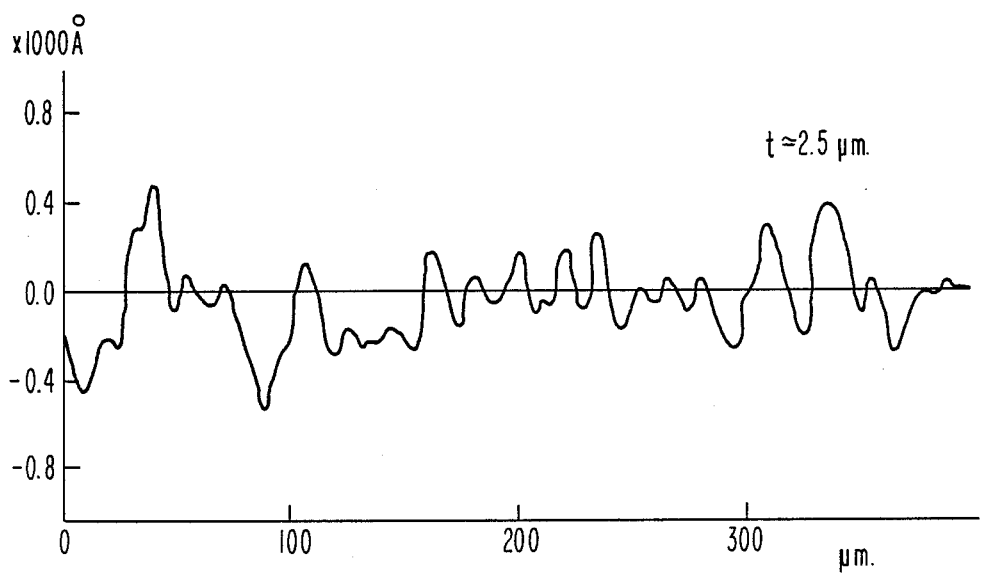
FIG. 3(b) shows the similar curve for the grown β-SiC epitaxial layer by the prior art method.

The similar curve for a single crystalline β-SiC grown directly on a Si(111) 4°-off substrate by the prior art method referred previously is shown in FIG. 3(b). In this case, the β-SiC layer is grown with a thickness of about 2.5 μm. The figure shows peak deviations from an average level exceed over ±40 nm levels.

Figure 4B:
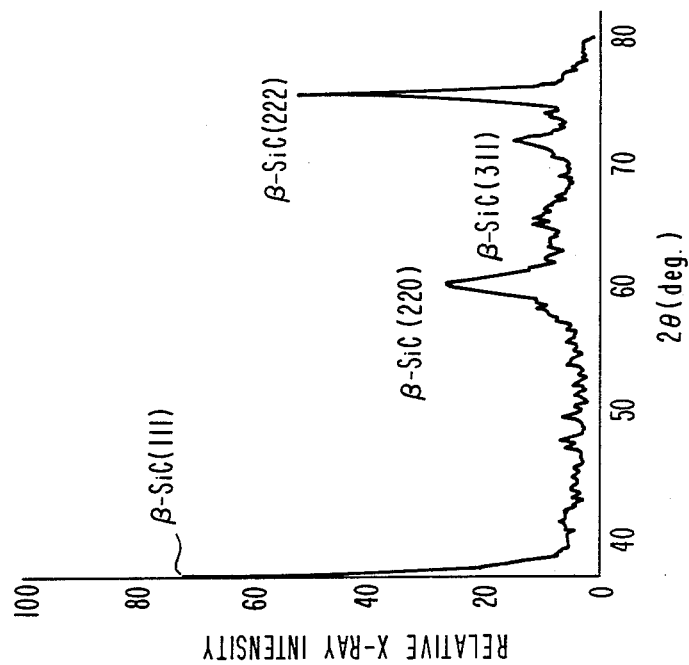
FIG. 4(b) shows the similar pattern for the β-SiC epitaxial layer grown by the prior art method.
Figure 4A:
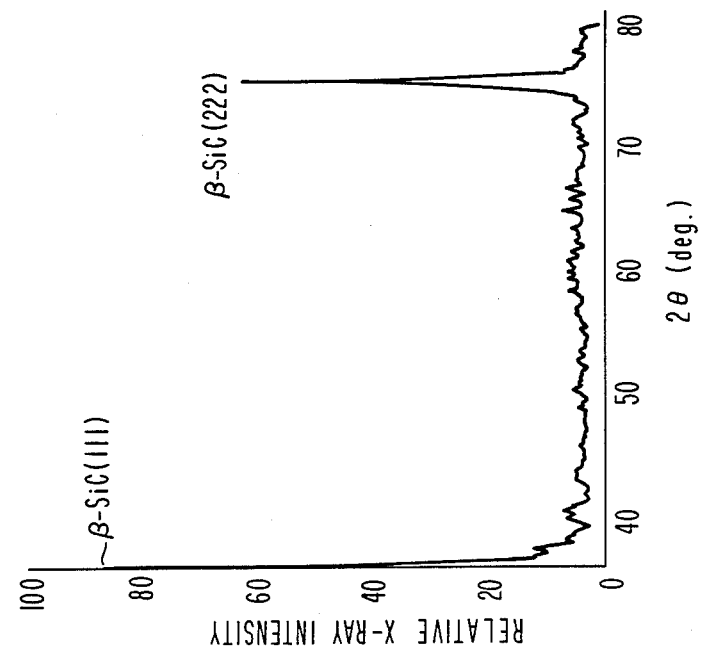
FIG. 4(a) shows an X-ray diffraction pattern for the β-SiC epitaxial layer grown by the present invention.

FIG. 4(a) shows an X-ray diffraction pattern using a Cu-Kα radiation for the grown β-SiC epitaxial layer on a Si(111) 4°-off substrate according to the present invention. And FIG. 4(b) shows the similar pattern for the β-SiC layer, which is grown directly on a silicon substrate without the buffer layer by the prior art method.

In FIG. 4(a), only two peaks, a strong (111) β-SiC peak and a relatively weak (222) β-SiC peak, are observed. Because the latter index (222) is an integral multiple of the index (111), it shows that the grown β-SiC layer of FIG. 4(a) is composed of a good single crystal. On the other hand, two extra peaks, i.e., (220) and (311) β-SiC peaks are observed in FIG. 4(b). It indicates that the grown β-SiC layer by the prior art method deteriorates in a crystalline structure and the grown layer is polycrystallized.

The results show that the method of the present invention makes it possible to grow a single crystalline β-SiC layer having a thickness greater than 1 μm at a low temperature less than 1000° C. The growth temperatures are 800° to 1000° C. (preferable 810° to 850° C.) for the buffer layer. The growth temperature for the single crystalline β-SiC layer is around or lower than 1000° C. (preferable 900 ±50° C.).

Compared with silicon, β-SiC has a wide energy gap, higher saturation electron velocity, higher break down voltage, and stronger mechanical strength. A thick single crystalline β-SiC layer on a silicon substrate will have many applications in a semiconductor field. Semiconductor devices with high quality, such as heterojunction diodes, heterojunction bipolar transistors and FETs, can be expected applying the method of the present invention.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the forgoing description, and all changes which come within the meaning and range of equivalence of the claims are, therefore, to be embraced therein.

What is claimed is:

1. A method of growing a single crystalline silicon carbide (β-SiC) layer on a silicon substrate, said method comprising the following steps of:
   (a) providing said silicon substrate in a reactor chamber,
   (b) reducing a pressure inside said reactor chamber to a subatmospheric level,
   (c) flowing a first mixed gas containing acetylene into said reactor chamber,
   (d) heating said silicon substrate at a temperature between 800° and 1000° C., whereby a buffer layer of carbonized silicon is grown on said silicon substrate,
   (e) stopping said first mixed gas and flowing a second mixed gas containing hydrocarbon and chlorosilane gases into said reactor chamber, and
   (f) heating said silicon substrate at a temperature lower than 1000° C., whereby said single crystalline silicon carbide (β-SiC) layer is grown on said buffer layer.

2. A method of growing a single crystalline silicon carbide (β-SiC) layer on a silicon substrate according to claim 1, wherein said hydrocarbon gas in step (e) is selected from a group of propane and acetylene gases.

3. A method of growing a single crystalline silicon carbide (β-SiC) layer on a silicon substrate according to claim 1, wherein said chlorosilane gas in step (e) is selected from a group of trichlorosilane and dichlorosilane gases.

4. A method of growing a single crystalline silicon carbide (β-SiC) layer on a silicon substrate according to claim 1, wherein said silicon substrate has a surface orientation of 0.5° to 10° off (111) toward [2$\bar{1}\bar{1}$].

5. A method of growing a single crystalline silicon carbide (β-SiC) layer on a silicon substrate according to claim 1, wherein said step (d) of growing said buffer layer continues until said buffer layer having a thickness from 60 to 100 angstroms is obtained.

6. A method of growing a single crystalline silicon carbide (β-SiC) layer on a silicon substrate according to claim 1, wherein said temperature of the silicon substrate in step (d) is in a range from 810° to 850° C.

7. A method of growing a single crystalline silicon carbide (β-SiC) layer on a silicon substrate according to claim 1, wherein said temperature of the silicon substrate in step (f) is in a range between 850° to 950° C.

8. A method of growing a single crystalline silicon carbide (β-SiC) layer on a silicon substrate according to claim 1, wherein said first mixed gas in step (c) contains a hydrogen gas and a mixing ratio of said hydrogen gas to acetylene gas is greater than 10.

9. A method of growing a single crystalline silicon carbide (β-SiC) layer on a silicon substrate according to claim 1, wherein a mixing ratio of said chlorosilane gas to hydrocarbon gas in step (e) is greater than 30.

10. A method of growing a single crystalline silicon carbide (β-SiC) layer on a silicon substrate according to claim 1, wherein said second mixed gas in step (e) contains a hydrogen gas and a mixing ratio of said hydrogen gas to other gases put together is greater than 10.

11. A method of growing a single crystalline silicon carbide (β-SiC) layer on a silicon substrate according to claim 1, wherein the growing process of said single crystalline silicon carbide (β-SiC) layer in steps (e) and (f) continues until said β-SiC layer having a thickness greater than 1 μm is obtained.

12. A method of growing a single crystalline silicon carbide (β-SiC) layer on a silicon substrate, said method comprising the following steps of:
(a) providing said silicon substrate in a reactor chamber,
(b) reducing a pressure inside said reactor chamber to a subatmospheric level,
(c) flow a hydrogen gas into said reactor chamber,
(d) heating said silicon substrate at a temperature between 800° and 1000° C., whereby a surface of said silicon substrate is cleaned,
(e) flowing a first mixed gas containing acetylene into said reactor chamber,
(f) heating said silicon substrate at a temperature between 80° and 1000° C., whereby a buffer layer of carbonized silicon is grown on said silicon substrate,
(g) stopping said first mixed gas and flowing a second mixed gas containing hydrocarbon and chlorosilane gases into said reactor chamber, and
(h) heating said silicon substrate at a temperature lower than 1000° C., whereby said single crystalline silicon carbide (β-SiC) layer is grown on said buffer layer.

* * * * *